(12) United States Patent
Nishijima

(10) Patent No.: US 8,816,722 B2
(45) Date of Patent: Aug. 26, 2014

(54) CURRENT DETECTION CIRCUIT

(75) Inventor: Tatsuji Nishijima, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 361 days.

(21) Appl. No.: 13/222,232

(22) Filed: Aug. 31, 2011

(65) Prior Publication Data
US 2012/0062240 A1  Mar. 15, 2012

(30) Foreign Application Priority Data
Sep. 13, 2010 (JP) ................... 2010-203901

(51) Int. Cl.
*H03D 1/00* (2006.01)
*G01R 19/00* (2006.01)

(52) U.S. Cl.
CPC .................. *G01R 19/0092* (2013.01)
USPC ................... 327/50; 327/72; 327/88

(58) Field of Classification Search
USPC ........... 327/50, 51, 63, 68–70, 72, 73, 77, 88, 327/538, 541, 543; 323/271, 285
See application file for complete search history.

(56) References Cited

U.S. PATENT DOCUMENTS 7,573,689 B2 *  8/2009  Hojo ........................... 361/93.1
7,659,706 B2    2/2010  Nishida
7,675,275 B2 *  3/2010  Ruobiao et al. ............... 323/271

FOREIGN PATENT DOCUMENTS

JP  2007-241411  9/2007

* cited by examiner

*Primary Examiner* — Long Nguyen
(74) *Attorney, Agent, or Firm* — Nixon Peabody LLP; Jeffrey L. Costellia

(57) ABSTRACT

An object is to widen detection range of current. A current detection circuit includes a first resistor, which is connected to a first connection terminal and a second connection terminal; a second resistor, which is connected to the first resistor; a third resistor, which is connected to the first resistor; a first transistor, a source of which is connected to the second resistor; a second transistor, a source of which is connected to the third resistor, and a drain and a gate of which is connected to a gate of the first transistor; a third transistor, a source of which is connected to the source of the second transistor, and a gate of which is connected to the drain of the first transistor; and a fourth resistor, which is connected to the drain of the third transistor, and to which a voltage is input.

18 Claims, 8 Drawing Sheets

CURRENT DETECTION CIRCUIT

BACKGROUND OF THE INVENTION

1. Field of the Invention

One embodiment of the present invention relates to a current detection circuit.

2. Description of the Related Art

In recent years, a current detection circuit which detects the amount of current flowing between two elements or circuits is known.

For example, when electric power is supplied from a photoelectric conversion device to a circuit which is a load and has a specific function (also referred to as a function circuit), it is preferable that a maximum power point tracker is provided and adjusts electric power supplied to the function circuit to have a maximum value. At that time, the maximum power point tracker includes a current detection circuit, a voltage detection circuit, and an arithmetic circuit. Values of a current and a voltage, which are supplied from the photoelectric conversion device, are detected by the current detection circuit and the voltage detection circuit, and the maximum power point tracker adjusts electric power supplied to the function circuit to have a maximum value in accordance with the detection result, with the use of the arithmetic circuit.

In some cases, a current detection circuit is provided to prevent reduction in cycling characteristics or breakdown due to overcharging of a lithium ion battery, for example.

As an example, the current detection circuit includes a differential amplifier circuit (e.g., Patent Document 1). As a differential amplifier circuit of a conventional current detection circuit, a differential amplifier circuit including a field-effect transistor is used, for example. A differential amplifier circuit including a field-effect transistor is used for a current detection circuit, whereby a manufacturing process can be simple and manufacturing cost can be reduced in comparison with the case of using an amplifier circuit including a bipolar transistor, for example.

REFERENCE

[Patent Document 1] Japanese Published Patent Application No. 2007-241411.

SUMMARY OF THE INVENTION

A conventional current detection circuit including a differential amplifier circuit using a field-effect transistor has a problem of small detection range of current.

For example, in a conventional current detection circuit including a differential amplifier circuit using a field-effect transistor, a detected current is converted to a voltage, and the converted voltage is input as an input signal to gates of field-effect transistors which are a differential pair in the differential amplifier circuit. Accordingly, the range of values of voltages of output signals does not depend on a value of the voltage of the input signal, and is in the range of a value of voltage which is input to a source. Therefore, even when a voltage input to the gates of the transistors which are a differential pair is higher than or equal to a power supply voltage or lower than or equal to a reference voltage, output voltages converge on specific values and current flowing between two elements cannot be accurately detected.

It is an object of one embodiment of the present invention to widen the detection range of current.

In one embodiment of the present invention, a signal is input to not a gate but a source of a transistor in a differential amplifier circuit included in a current detection circuit, whereby a current can be detected even when a voltage input to the source is higher than or equal to a power supply voltage or lower than or equal to a reference voltage.

One embodiment of the present invention is a current detection circuit. The current detection circuit comprises a first connection terminal; a second connection terminal; a first resistor, one terminal of which is connected to the first connection terminal and the other terminal of which is connected to the second connection terminal; a second resistor, one terminal of which is connected to the one terminal of the first resistor; a third resistor, one terminal of which is connected to the other terminal of the first resistor; a first current source; a second current source; a first field-effect transistor having a source connected to the other terminal of the second resistor and a drain connected to the first current source, in which a voltage of the drain is set at a value in accordance with a current generated by the first current source; a second field-effect transistor which has the same conductivity type as the first field-effect transistor having a source connected to the third resistor and a drain and gate connected to a gate of the first field-effect transistor and the second current source, in which a voltage of the gate and a voltage of the drain are set at values in accordance with a current generated by the second current source; a third field-effect transistor having the same conductivity type as the first field-effect transistor, which has a source connected to the source of the second field-effect transistor and a gate connected to the drain of the first field-effect transistor, and in which a voltage of a drain is output as a signal; and a fourth resistor, one terminal of which is connected to the drain of the third field-effect transistor, and in which a unit voltage is input to the other terminal.

According to one embodiment of the present invention, the detection range of current can be widened.

DETAILED DESCRIPTION OF THE INVENTION

Examples of embodiments explaining the present invention will be described below with reference to the drawings. Note that the invention is not limited to the following description, and it will be easily understood by those skilled in the art that various changes and modifications can be made without departing from the spirit and scope of the invention. Thus, the present invention should not be interpreted as being limited to the following description of the embodiments.

Note that the contents in different embodiments can be combined with one another as appropriate. In addition, the contents in different embodiments can be interchanged one another.

Further, terms using ordinal numbers such as "first" and "second" are added for avoiding confusion of components and the components are not bounded by the ordinal numbers.

Embodiment 1

In this embodiment, an example of a current detection circuit will be described.

Figure 1:
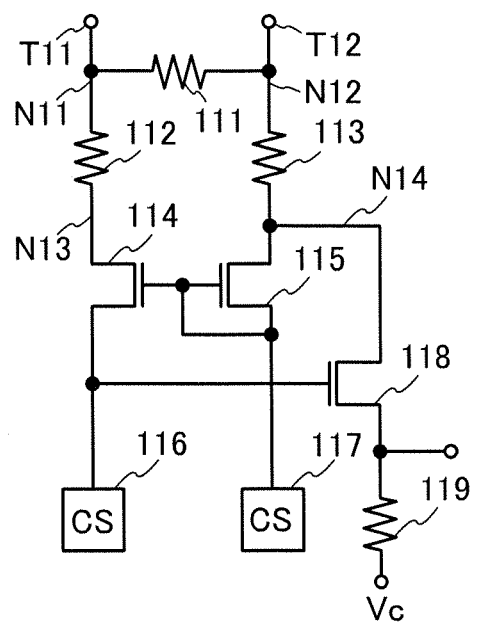
FIG. 1 illustrates a configuration example of a current detection circuit in Embodiment 1.

First, a configuration example of a current detection circuit in this embodiment is described with reference to FIG. 1. FIG. 1 illustrates a configuration example of a current detection circuit in this embodiment.

The current detection circuit in FIG. 1 includes a resistor 111, a resistor 112, a resistor 113, a transistor 114, a transistor 115, a current source (also referred to as CS) 116, a current source 117, a transistor 118, and a resistor 119.

Note that in the current detection circuit, the transistor includes two terminals and a current control terminal for controlling current flowing between the two terminals by applied voltage. Note that without limitation to the transistor, in an element, two terminals between which current is controlled are also referred to as the current terminals. The two current terminals are also referred to as a first current terminal and a second current terminal.

Further, in the current detection circuit, a field-effect transistor can be used as the transistor, for example. In the field-effect transistor, a first current terminal is one of a source and a drain, a second current terminal is the other of the source and the drain, and a current control terminal is a gate.

In the current detection circuit, a current flows between two terminals of a resistor. One of the terminals included in a resistor is also referred to as a first resistor terminal and a second resistor terminal, respectively.

A first resistor terminal of the resistor 111 is connected to a connection terminal T11. A second resistor terminal of the resistor 111 is connected to a connection terminal T12. When a current flows between the first resistor terminal and the second resistor terminal of the resistor 111, the resistor 111 converts the current into a voltage. The resistor 111 is also referred to as a shunt resistor. The resistance value of the resistor 111 is preferably smaller than each of the resistance values of the resistor 112, the resistor 113, and the resistor 119.

Note that voltage generally refers to a difference between potentials at two points (also referred to as a potential difference). However, values of both a voltage and a potential are represented using volt (V) in a circuit diagram or the like in some cases, so that it is difficult to discriminate between them. This is why in this specification, a potential difference between a potential at one point and a potential to be the reference (also referred to as the reference potential) is used as a voltage at the point in some cases.

A first resistor terminal of the resistor 112 is connected to the first resistor terminal of the resistor 111. Note that a connection portion of the first resistor terminal of the resistor 112 and the first resistor terminal of the resistor 111 is also referred to as a node N11.

A first resistor terminal of the resistor 113 is connected to the second resistor terminal of the resistor 111. Note that a connection portion of the first resistor terminal of the resistor 113 and the second resistor terminal of the resistor 111 is also referred to as a node N12.

The current source 116 and the current source 117 include transistors, for example. For example, the current source 116 and the current source 117 each can include a reference current source and a current mirror circuit including transistors.

A source of the transistor 114 is connected to a second resistor terminal of the resistor 112. A drain of the transistor 114 is connected to the current source 116. Note that a connection portion of the source of the transistor 114 and the second resistor terminal of the resistor 112 is also referred to as a node N13. A value of the voltage of the drain of the transistor 114 is set in accordance with a current generated by the current source 116.

A source of the transistor 115 is connected to a second resistor terminal of the resistor 113. A drain of the transistor 115 is connected to a gate of the transistor 114, a gate of the transistor 115, and the current source 117. A value of the voltage of the drain of the transistor 115 is set in accordance with a current generated by the current source 117.

A source of the transistor 118 is connected to the source of the transistor 115. A gate of the transistor 118 is connected to the drain of the transistor 114. Note that a connection portion of the source of the transistor 118, the second resistor terminal of the resistor 113, and the source of the transistor 115 is also referred to as a node N14. A voltage of a drain of the transistor 118 is a voltage (also referred to as a voltage Vout) of an output signal of the current detection circuit and is output as an output signal.

Note that polarities of the transistor 114, the transistor 115, and the transistor 118 are the same.

As the transistor 114, the transistor 115, and the transistor 118, a transistor in which a channel is formed and which has a layer including, for example, an amorphous semiconductor, a microcrystalline semiconductor, a polycrystalline semiconductor, or a single crystal semiconductor can be used. As a semiconductor layer in which a channel is formed, a semiconductor layer including a semiconductor belonging to Group 14 of the periodic table (e.g., silicon) can be used.

Further, in the case where the current detection circuit is formed using an N-channel transistor, a transistor including an oxide semiconductor layer in which a channel is formed can be used as the N-channel transistor. As the N-channel transistor, a transistor including an oxide semiconductor layer which is made to be intrinsic (I-type) or substantially intrinsic by, for example, high purification can be used.

A first resistor terminal of the resistor 119 is connected to the drain of the transistor 118. A voltage Vc is input to a second resistor terminal of the resistor 119. The value of the voltage Vc can be set as appropriate in accordance with the conductivity types of the transistor 114, the transistor 115, and the transistor 118, for example.

In the current detection circuit in FIG. 1, a differential amplifier circuit includes the transistor 114 and the transistor 115.

Next, an example of a driving method of the current detection circuit in FIG. 1 will be described. Note that here, it is assumed that the transistor 114, the transistor 115, and the transistor 118 are P-channel transistors, and the voltage Vc is a low power supply voltage Vss. Since the transistor 114, the transistor 115, and the transistor 118 are P-channel transistors, and the voltage Vc is the low power supply voltage Vss, a current can be detected even when a voltage which is higher than or equal to power supply voltage is input to the differential amplifier circuit in the current detection circuit. Further, here, there is no variation in characteristics of transistors.

A high supply voltage Vdd is a voltage, the value of which is relatively higher than that of the low supply voltage Vss. The low supply voltage Vss is a voltage the value of which is relatively lower than that of the high supply voltage Vdd.

In the current detection circuit in FIG. 1, a current flows from the connection terminal T12 to the connection terminal T11. Then, a current flows from the second resistor terminal of the resistor 111 to the first resistor terminal of the resistor 111. At that time, when a voltage of the node N11 is a voltage VA and a voltage of the node N12 is a voltage VB, a value of the voltage VA is a changed value of the voltage VB because of voltage drop of the resistor 111.

Further, a voltage of the node N13 (also referred to as a voltage $V_{N13}$) has a value in accordance with the voltage VA, a resistance of the resistor 112 (also referred to as a resistance $R_{112}$), and a current (also referred to as a current Ia) flowing through the source of the transistor 114, the drain of the transistor 114, and the current source 116. That is to say, $V_{N13}=VA-(R_{112}\times Ia)$.

Furthermore, a voltage of the node N14 (also referred to as the voltage $V_{N14}$) has a value in accordance with the voltage VB, a resistance of the resistor 113 (also referred to as a resistance $R_{113}$), a current (also referred to as a current Ib) through the source of the transistor 115, the drain of the transistor 115, and the current source 117, a current (also referred to as a current Ic) flowing through the source of the transistor 118, the drain of the transistor 118, and the resistor 119. That is to say, $V_{N14}=VB-R_{113}(Ib+Ic)$.

In the current detection circuit in FIG. 1, the differential amplifier circuit including the transistor 114, the transistor 115, the current source 116, and the current source 117 forms negative feedback in such a manner that the node N14, which is one input, and an output (the drain of the transistor 118) establish electrical continuity through the source of the transistor 118 and the drain of the transistor 118. Accordingly, the node N13 and the node N14 which are inputs of the differential amplifier circuit are virtually short-circuited; the voltage of the node N13 and the voltage of the node N14 are equal to each other. Accordingly, $VA-(R_{112}\times Ia)=VB-R_{113}(Ib+Ic)$.

Therefore, $Ic=(1/R_{113})(VB-VA-Vx)$. At this time, the voltage Vx is an offset voltage which is generated when there is a difference between a product of the resistance $R_{112}$ and the current Ia and a product of resistance value $R_{113}$ and the current Ib, and can be expressed by the formula $Vx=(R_{113}\times Ib)-(R_{112}\times Ia)$. Further, the voltage Vout is set by a resistance of the resistor 119 (also referred to as a resistance $R_{119}$) and the current Ic. That is to say, $Vout=(R_{119}/R_{113})(VB-VA-Vx)$. Accordingly, the voltage Vout has a value in accordance with a current flowing through the resistor 111; therefore, a current flowing through the resistor 111 can be detected from a value of the voltage Vout.

Next, another example of a driving method of the current detection circuit in FIG. 1 will be described. Note that here, it is assumed that the transistor 114, the transistor 115, and the transistor 118 are N-channel transistors, and the voltage Vc is the high power supply voltage Vdd. Since the transistor 114, the transistor 115, and the transistor 118 are N-channel transistors, and the voltage Vc is the high power supply voltage Vdd, a current can be detected even when a voltage which is lower than or equal to a reference potential is input to the differential amplifier circuit in the current detection circuit. Further, here, there is no variation in characteristics of transistors.

In the current detection circuit in FIG. 1, a current flows from the connection terminal T11 to the connection terminal T12. Then, a current flows from the first resistor terminal of the resistor 111 to the second resistor terminal of the resistor 111. At that time, when a voltage of the node N11 is a voltage VA and a voltage of the node N12 is a voltage VB, a value of the voltage VB is a changed value of the voltage VA because of voltage drop of the resistor 111.

Further, the voltage $V_{N13}$ has a value in accordance with the voltage VA, the resistance $R_{112}$, and the current Ia. That is to say, $V_{N13}=VA+(R_{112}\times Ia)$.

Furthermore, the voltage $V_{N14}$ has a value in accordance with the voltage VB, the resistance $R_{113}$, the current Ib, and the current Ic. That is to say, $V_{N14}=VB+R_{113}(Ib+Ic)$.

In the current detection circuit in FIG. 1, the differential amplifier circuit including the transistor 114, the transistor 115, the current source 116, and the current source 117 forms negative feedback in such a manner that the node N14, which is one input, and an output (the drain of the transistor 118) establish electrical continuity through the source of the transistor 118 and the drain of the transistor 118. Accordingly, the node N13 and the node N14 which are inputs of the differential amplifier circuit are virtually short-circuited; the voltage of the node N13 and the voltage of the node N14 are equal to each other. Accordingly, $VA+(R_{112}\times Ia)=VB+R_{113}(Ib+Ic)$.

Moreover, $Ic=(1/R_{113})(VA-VB-Vx)$. At this time, the voltage Vx is an offset voltage which is generated when there is a difference between a product of the resistance $R_{112}$ and the current Ia and a product of resistance $R_{113}$ and the current Ib, and can be expressed by the formula $Vx=(R_{113}\times Ib)-(R_{112}\times Ia)$. Further, the voltage Vout has a value obtained by subtraction of the value set by the resistance $R_{119}$ and the current Ic from the high power supply voltage Vdd. That is to say, $Vout=Vdd-(R_{119}/R_{113})(VB-VA-Vx)$. Accordingly, the voltage Vout has a value in accordance with a current flowing through the resistor 111; therefore, a current flowing through the resistor 111 can be detected.

As described with reference to FIG. 1, an example of a current detection circuit in this embodiment includes a resistor with a function as a shunt resistor, two field-effect transistors which is a differential pair in a differential amplifier circuit, and a current source. In the current detection circuit, part of current flowing between two connection terminals is converted into a voltage with the use of a resistor; the voltage is input as a signal to sources of the field-effect transistors which are a differential pair in the differential amplifier circuit; and a value of a voltage of an output signal is set in accordance with the voltage input to the sources of the field-effect transistors. With the above configuration, gates of the field-effect transistors can be set freely by the current source. Therefore, with the above configuration, even when a voltage input to the sources of the field-effect transistors which are the differential pair in the differential amplifier circuit is, for example, higher than or equal to a power supply voltage and lower than or equal to a ground potential, a voltage of an output signal can be set in accordance with the sources of the field-effect transistors; accordingly, the detection range of current can be widened.

Embodiment 2

In this embodiment, an example of a current source which can be applied to the current detection circuit in the above embodiment will be described.

Figure 2:
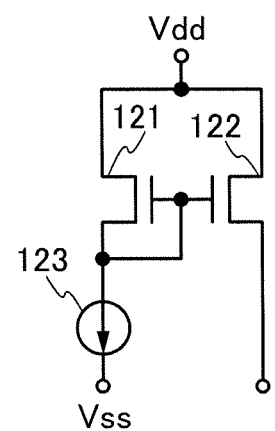
FIG. 2 is a circuit diagram illustrating a configuration example of a current source in Embodiment 2.

A configuration example of a current source in this embodiment will be described with reference to FIG. 2. FIG. 2 is a circuit diagram illustrating an example of the current source in this embodiment.

A current source in FIG. 2 includes a transistor 121, a transistor 122, and a reference current source 123.

The transistor 121 is a P-channel transistor. The high power supply voltage Vdd is input to a source of the transistor 121. A drain of the transistor 121 is connected to a gate of the transistor 121. The transistor 121 has a function as a reference transistor of a current mirror circuit.

The transistor 122 is a P-channel transistor. The high power supply voltage Vdd is input to a source of the transistor 122. A gate of the transistor 122 is connected to the gate of the transistor 121. The transistor 122 has a function as an output transistor of the current mirror circuit.

The reference current source 123 has a first current terminal and a second current terminal. The first current terminal of the reference current source 123 is connected to the drain of the transistor 121. The low power supply voltage Vss is input to the second current terminal of the reference current source 123.

As the transistor 121 and the transistor 122, a transistor in which a channel is formed and which has a layer including, for example, an amorphous semiconductor, a microcrystalline semiconductor, a polycrystalline semiconductor, or a single crystal semiconductor can be used. As a semiconductor layer in which a channel is formed, a semiconductor layer including a semiconductor belonging to Group 14 of the periodic table (e.g., silicon) can be used.

Then, an example of a driving method of the current source in FIG. 2 will be described.

In an example of a driving method of the current source in FIG. 2, when a current flows through the source of the transistor 121, the drain of the transistor 121, the first current terminal of the reference current source 123, and the second current terminal of the reference current source 123, a voltage of the gate of the transistor 121 and a voltage of the gate of the transistor 122 becomes equal to each other; thus, current flows through the source of the transistor 122 and the drain of the transistor 122. The current flowing through the source of the transistor 122 and the drain of the transistor 122 is set in accordance with the power supply voltage and a current flowing through the reference current source 123.

As described with reference to FIG. 2, the current source in this embodiment includes a reference current source and a current mirror circuit. With the configuration, a current source which generates a current with a predetermined value flows can be formed.

Further, output transistors which are formed in respective stages are formed, whereby a current source which generates a plurality of currents with predetermined values can be formed.

Embodiment 3

In this embodiment, an example of a transistor which can be applied to the current detection circuit in the above embodiment will be described.

In the current detection circuit described in the above embodiment, as the transistor, for example, it is possible to use a transistor including a semiconductor layer containing a semiconductor (e.g., silicon) that belongs to Group 14 in the periodic table. A channel is formed in the semiconductor layer of the transistors. Note that a layer in which a channel is formed is also referred to as a channel formation layer.

The semiconductor layer may be a single crystal semiconductor layer, a polycrystalline semiconductor layer, a microcrystalline semiconductor layer, or an amorphous semiconductor layer.

Further, in the current detection circuit described in the above embodiment, when the current detection circuit includes an N-channel transistor, a transistor including an oxide semiconductor layer in which a channel is formed can be used as the N-channel transistor. As the N-channel transistor, a transistor including an oxide semiconductor layer which is made to be intrinsic (I-type) or substantially intrinsic by high purification can be used, for example. By high purification of the oxide semiconductor layer, the carrier concentration of the oxide semiconductor layer can be lower than $1 \times 10^{14}/cm^3$, preferably lower than $1 \times 10^{12}/cm^3$, further preferably lower than $1 \times 10^{11}/cm^3$, and thus, change in characteristics due to temperature change can be suppressed. Further, with the above structure, off-state current per micrometer of channel width can be 10 aA ($1 \times 10^{-17}$ A) or lower, 1 aA ($1 \times 10^{-18}$ A) or lower, 10 zA ($1 \times 10^{-20}$ A) or lower, 1 zA ($1 \times 10^{-21}$ A) or lower, or 100 yA ($1 \times 10^{-22}$ A) or lower. It is preferable that the off-state current of the transistor be as low as possible. The lowest value of the off-state current of the transistor in this embodiment is estimated to be about $10^{-30}$ A/μm.

A transistor including the oxide semiconductor layer may be used as an N-channel transistor, and a transistor including a semiconductor layer containing a semiconductor (e.g., silicon) that belongs to Group 14 in the periodic table may be used as a P-channel transistor.

Figure 3A:
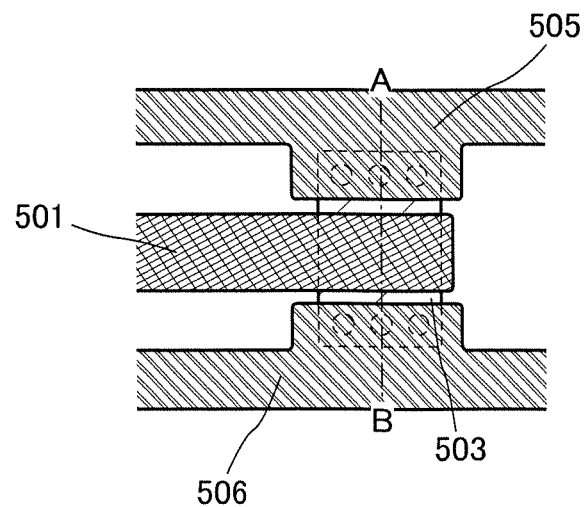
FIGS. 3A and 3B illustrate a configuration example of a transistor in Embodiment 3.
Figure 3B:
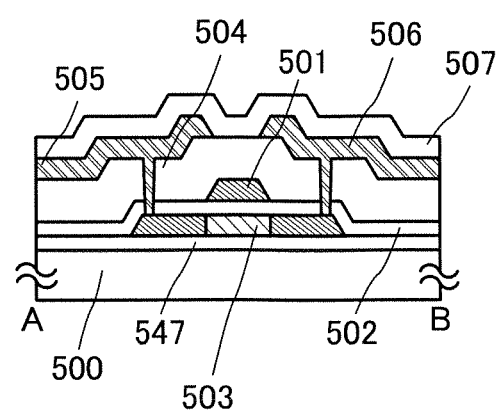

An example of a structure of the transistor including a semiconductor layer containing a semiconductor that belongs to Group 14 in the periodic table will be described with reference to FIGS. 3A and 3B. FIGS. 3A and 3B illustrate an example of a structure of a transistor in this embodiment. FIG. 3A is a schematic top view and FIG. 3B is a schematic cross sectional view taken along a line A-B in FIG. 3A.

A transistor in FIGS. 3A and 3B is one kind of top-gate transistor. Note that as a transistor in the current detection circuit in the above embodiment, a bottom-gate transistor can be used.

The transistor in FIGS. 3A and 3B includes a conductive layer 501, an insulating layer 502, a semiconductor layer 503, a conductive layer 505, and a conductive layer 506.

The semiconductor layer 503 is provided over a substrate 500 with an insulating layer 547 provided therebetween.

The insulating layer 502 is provided over the insulating layer 547 with the semiconductor layer 503 provided therebetween. Note that the whole of the semiconductor layer 503 may be protected by the insulating layer 502 and the insulating layer 547. With the above structure, entry of impurities into the semiconductor layer 503 can be suppressed.

The conductive layer 501 overlaps with part of the semiconductor layer 503 with the insulating layer 502 provided therebetween.

Each of the conductive layer 505 and the conductive layer 506 is electrically connected to the semiconductor layer 503. For example, each of the conductive layer 505 and the conductive layer 506 is electrically connected to the semiconductor layer 503 with an insulating layer 504, which is provided therebetween and is provided over the insulating layer 502 and the conductive layer 501, through openings reaching the semiconductor layer 503.

Components in FIGS. 3A and 3B will be described.

As the substrate 500, a glass substrate, a quartz substrate, a semiconductor substrate, or a plastic substrate can be used.

The conductive layer 501 has a function as a gate of the transistor. A conductive layer with a function as a gate of a transistor is also referred to as a gate electrode and a gate wiring.

The conductive layer 501 can be, for example, a layer of a metal material such as molybdenum, titanium, chromium, tantalum, tungsten, aluminum, copper, neodymium, or scandium; or an alloy material containing any of these materials as a main component. Alternatively, the conductive layer 501 can be a stack of any of the materials applicable to the conductive layer 501.

The insulating layer 502 has a function as a gate insulating layer of the transistor.

As the insulating layer 502, a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, or a hafnium oxide layer can be used, for example. Alternatively, the insulating layer 502 can be a stack of any of the materials applicable to the insulating layer 502.

The insulating layer 547 has a function of a base layer which prevents diffusion of impurity elements from the substrate 500.

The insulating layer 547 can be, for example, a layer of any of the materials applicable to the insulating layer 502. Alternatively, the insulating layer 547 may be a stack of any of the materials applicable to the insulating layer 502.

The semiconductor layer 503 has a function as a layer in which a channel of the transistor is formed (also referred to as a channel formation layer). The semiconductor layer 503 is provided with a pair of impurity regions and includes a channel formation region between the impurity regions. An impurity region is a region including an impurity element imparting N-type conductivity or an impurity element imparting P-type conductivity. Alternatively, a plurality of impurity regions having different concentrations of impurity elements may be provided. At this time, a region in which the concentration of impurity elements is relatively low is a lightly doped region. The provision of the lightly doped region can suppress the local concentration of electric field.

As the semiconductor layer 503, a layer including, for example, an amorphous semiconductor, a microcrystalline semiconductor, a polycrystalline semiconductor, or a single crystal semiconductor can be used. As the semiconductor layer 503, a semiconductor layer including a semiconductor (e.g., silicon) that belongs to Group 14 in the periodic table can be used, for example.

As the insulating layer 504, a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, or a hafnium oxide layer can be used, for example. Alternatively, the insulating layer 504 can be a stack of any of the materials applicable to the insulating layer 504.

The conductive layer 505 and the conductive layer 506 have functions as a source and a drain of the transistor. A conductive layer having a function as the source of the transistor also referred to as a source electrode or a source wiring. A conductive layer having a function as the drain of the transistor also referred to as a drain electrode or a drain wiring.

As the conductive layer 505 and the conductive layer 506, a layer of a metal material such as aluminum, chromium, copper, tantalum, titanium, molybdenum, or tungsten; or an alloy material containing the metal material as a main component can be used, for example. Alternatively, the conductive layer 505 and the conductive layer 506 can be a stack of any of the materials applicable to the conductive layer 505 and the conductive layer 506.

Alternatively, the conductive layer 505 and the conductive layer 506 can be a layer containing a conductive metal oxide. Examples of the conductive metal oxide are indium oxide, tin oxide, zinc oxide, an alloy of indium oxide and tin oxide, and an alloy of indium oxide and zinc oxide. Note that the conductive metal oxide applicable to the conductive layer 505 and the conductive layer 506 may contain silicon oxide.

For example, a film of a material applicable to the conductive layer 505 and the conductive layer 506 is formed by sputtering, and the film is partly etched, whereby the conductive layer 505 and the conductive layer 506 can be formed.

As an insulating layer 507, a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, or a hafnium oxide layer can be used, for example. Alternatively, the insulating layer 507 can be a stack of any of the materials applicable to the insulating layer 507.

Next, an example of a manufacturing method of the transistor in FIGS. 3A and 3B will be described.

First, the substrate 500 is prepared, and the insulating layer 547 is formed over the substrate 500.

For example, the insulating layer 547 is a layer of a material, which is applicable to the insulating layer 547, formed by sputtering, CVD, or the like.

Next, the semiconductor layer 503 is formed over the insulating layer 547.

For example, a film of a material applicable to the semiconductor layer 503 is formed by sputtering or CVD, and the film is partly etched, whereby the semiconductor layer 503 can be formed.

In the transistor of this embodiment, for example, the following steps in order to form a layer by etching part of a film: a resist mask is formed over part of the film by a photolithography process and the film is etched using the resist mask, thereby forming the layer. Note that in this case, the resist mask is removed after the layer is formed.

When the semiconductor layer 503 is formed of a polycrystalline semiconductor film, the polycrystalline semiconductor film can be formed by crystallizing an amorphous semiconductor film by a known technique (such as a solid-phase epitaxy method, a laser crystallization method, or a crystallization method using catalytic metal), for example.

When the semiconductor layer 503 is formed of a single crystal semiconductor layer, the semiconductor layer 503 can be formed in a silicon-on-insulator (SOI) substrate. As the SOI substrate, a known SOI substrate can be used, and a manufacturing method and a structure thereof are not limited to particular types. As the SOI substrate, a SIMOX substrate and a bonded substrate can be typically given. Further, examples of the bonded substrate include ELTRAN (registered trademark), UNIBOND (registered trademark), and Smart Cut (registered trademark).

For example, the SIMOX substrate can be manufactured in such a manner that an oxygen ion is introduced into a single crystal silicon substrate, and heat treatment at 1300° C. or more is performed to form a buried oxide layer, so that a silicon layer is formed on the surface of the single crystal silicon substrate. The silicon layer is insulated from the single crystal silicon substrate with the buried oxide layer. Further, the SIMOX substrate can be formed by a technique referred to as ITOX (internal thermal oxidation-SIMOX) in which thermal oxidation is further performed after a buried oxide layer is formed.

A bonded substrate can be formed in such a manner that two single crystal silicon substrates (a first single crystal silicon substrate and a second single crystal silicon substrate) are bonded with an oxide layer provided therebetween, and one of the single crystal silicon substrates is thinned from a surface on the side which is opposite to the bonded side. At that time, the oxide layer can be formed by thermal oxidation of one of the substrates (here, the first single crystal silicon substrate). Further, the two single crystal silicon substrates can be bonded directly without using an adhesive. Furthermore, the bonded substrate may be formed in such a manner that a substrate having an insulating surface, such as a glass substrate and a single crystal silicon substrate are bonded to each other, without being limited to bonding two single crystal silicon substrates.

Next, the insulating layer 502 is formed over the insulating layer 547 with the semiconductor layer 503 provided therebetween.

For example, the insulating layer 502 is a layer of a material, which is applicable to the insulating layer 502, formed by sputtering, CVD, or the like.

Next, the conductive layer 501 is formed to overlap with the semiconductor layer 503 with the insulating layer 502 provided therebetween.

For example, a film of a material applicable to the conductive layer 501 is formed by sputtering, and the film is partly etched, whereby the conductive layer 501 can be formed.

Next, an impurity region is formed in part of the semiconductor layer 503.

For example, an impurity region can be formed in such a manner that an impurity element imparting N-type conductivity or an impurity element imparting P-type conductivity is added to the semiconductor layer 503 with the use of the conductive layer 501 as a mask.

Next, the insulating layer 504 is formed over the conductive layer 501.

For example, the insulating layer 504 is a layer of a material, which is applicable to the insulating layer 504, formed by sputtering, CVD, or the like.

Next, a plurality of openings penetrating the insulating layer 502 and the insulating layer 504 is formed.

Next, the conductive layer 505 in contact with one of the pair of impurity regions in the semiconductor layer 503 through the opening is formed over the insulating layer 504, and the conductive layer 506 in contact with the other of the pair of impurity regions in the semiconductor layer 503 through the opening is formed over the insulating layer 504.

For example, a film of a material applicable to the conductive layer 505 and the conductive layer 506 is formed by sputtering, and the film is partly etched, whereby the conductive layer 505 and the conductive layer 506 can be formed.

Next, the insulating layer 507 is formed over the insulating layer 504, the conductive layer 505, and the conductive layer 506.

For example, the insulating layer 507 is a layer of a material, which is applicable to the insulating layer 507, formed by sputtering, CVD, or the like.

As described with reference to FIGS. 3A and 3B, an example of a transistor in this embodiment is the transistor including a semiconductor layer containing a semiconductor that belongs to Group 14 in the periodic table. A channel is formed in the semiconductor layer of the transistors. With the use of a transistor with the structure, the current detection circuit in the above embodiment can be formed.

Embodiment 4

In this embodiment, an example of a current detection circuit which can detect current even in the case of a voltage which is higher than or equal to the power supply voltage will be described.

Figure 4:
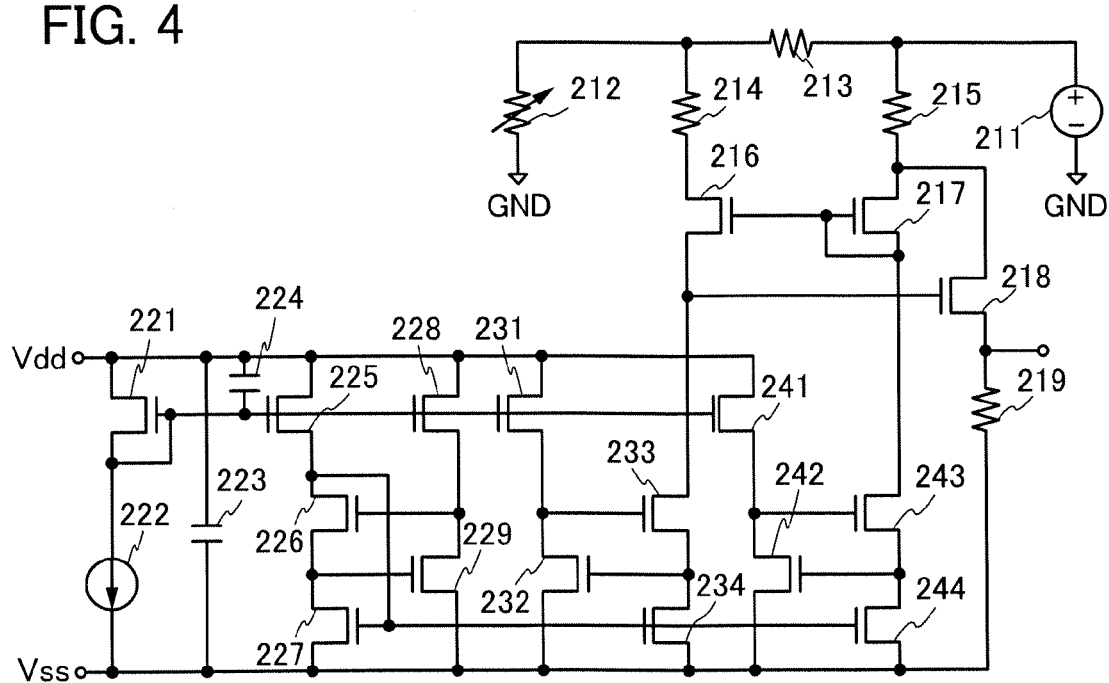
FIG. 4 illustrates an example of a current detection circuit in Embodiment 4.

First, a configuration example of the current detection circuit in this embodiment will be described with reference to FIG. 4. FIG. 4 illustrates an configuration example of the current detection circuit in this embodiment.

The current detection circuit in FIG. 4 includes a power feeding element 211, a resistor 212, a resistor 213, a resistor 214, a resistor 215, a transistor 216, a transistor 217, the transistor 218, a resistor 219, a transistor 221, a reference current source 222, a capacitor 223, a capacitor 224, a transistor 225, a transistor 226, a transistor 227, a transistor 228, a transistor 229, a transistor 231, a transistor 232, a transistor 233, a transistor 234, a transistor 241, a transistor 242, a transistor 243, and a transistor 244.

Note that, in the current detection circuit, the capacitor includes a first capacitor electrode, a second capacitor electrode, and a dielectric layer overlapping with the first capacitor electrode and the second capacitor electrode. The capacitor accumulates electric charge in accordance with a voltage applied between the first capacitor electrode and the second capacitor electrode.

The power feeding element 211 includes a positive electrode and a negative electrode. A ground potential (also referred to as the potential GND) which is a reference potential is input to the negative electrode of the power feeding element 211. As the power feeding element 211, a photoelectric conversion device or the like can be used.

The resistor 212 is a variable resistor. The ground potential is input to a first resistor terminal of the resistor 212. The resistance value of the resistor 212 can be set as appropriate in accordance with the amount of current flowing through the resistor 213.

A first resistor terminal of the resistor 213 is connected to a second resistor terminal of the resistor 212. A second resistor terminal of the resistor 213 is connected to the positive electrode of the power feeding element 211.

A first resistor terminal of the resistor 214 is connected to the first resistor terminal of the resistor 213.

A first resistor terminal of the resistor 215 is connected to the second resistor terminal of the resistor 213.

The transistor 216 is a P-channel transistor. A source of the transistor 216 is connected to a second resistor terminal of the resistor 214.

The transistor 217 is a P-channel transistor. A source of the transistor 217 is connected to a second resistor terminal of the resistor 215. A gate of the transistor 217 is connected to a drain of the transistor 217 and a gate of the transistor 216.

The transistor 218 is a P-channel transistor. A source of the transistor 218 is connected to the source of the transistor 217. A gate of the transistor 218 is connected to a drain of the transistor 216. A voltage of a drain of the transistor 218 is a voltage of an output signal of the current detection circuit.

A first resistor terminal of the resistor 219 is connected to the drain of the transistor 218. The low power supply voltage Vss is input to a second resistor terminal of the resistor 219.

The transistor 221 is a P-channel transistor. The high power supply voltage Vdd is input to a source of the transistor 221. A drain of the transistor 221 is connected to a gate of the transistor 221.

The reference current source 222 includes a first current terminal and a second current terminal. The first current terminal of the reference current source 222 is connected to the drain of the transistor 221. The low power supply voltage Vss is input to, the second current terminal of the reference current source 222. Current flows from the first current terminal of the reference current source 222 to the second current terminal of the reference current source 222.

The high power supply voltage Vdd is input to a first capacitor electrode of the capacitor 223. The low power supply voltage Vss is input to a second capacitor electrode of the capacitor 223. Note that it is not necessary to provide the capacitor 223, but a value of inputted power supply voltage can be stable by the capacitor 223.

The high power supply voltage Vdd is input to a first capacitor electrode of the capacitor 224. A second capacitor electrode of the capacitor 224 is connected to the gate of the transistor 221. Note that it is not necessary to provide the capacitor 224, but a value of inputted power supply voltage can be stable by the capacitor 224.

The transistor 225 is a P-channel transistor. The high power supply voltage Vdd is input to a source of the transistor 225. A gate of the transistor 225 is connected to the gate of the transistor 221.

The transistor 226 is an N-channel transistor. A drain of the transistor 226 is connected to a drain of the transistor 225.

The transistor 227 is an N-channel transistor. A drain of the transistor 227 is connected to a source of the transistor 226. The low power supply voltage Vss is input to a source of the transistor 227. A gate of the transistor 227 is connected to the drain of the transistor 225.

The transistor 228 is a P-channel transistor. The high power supply voltage Vdd is input to a source of the transistor 228. A gate of the transistor 228 is connected to the gate of the transistor 221.

The transistor 229 is an N-channel transistor. A drain of the transistor 229 is connected to a drain of the transistor 228. The low power supply voltage Vss is input to a source of the transistor 229. A gate of the transistor 229 is connected to the source of the transistor 226.

Note that it is not necessary to provide the transistor 226 and the transistor 229, but a value of current flowing between the source and the drain of the transistor 227 can be stable by the transistor 226 and the transistor 229.

The transistor 231 is a P-channel transistor. The high power supply voltage Vdd is input to a source of the transistor 231. A gate of the transistor 231 is connected to the gate of the transistor 221.

The transistor 232 is an N-channel transistor. A drain of the transistor 232 is connected to a drain of the transistor 231. The low power supply voltage Vss is input to a source of the transistor 232.

The transistor 233 is an N-channel transistor. A drain of the transistor 233 is connected to a drain of the transistor 216. A gate of the transistor 233 is connected to the drain of the transistor 231.

The transistor 234 is an N-channel transistor. A drain of the transistor 234 is connected to a gate of the transistor 232 and a source of the transistor 233. The low power supply voltage Vss is input to a source of the transistor 234. A gate of the transistor 234 is connected to the gate of the transistor 227.

Note that it is not necessary to provide the transistor 232 and the transistor 233, but a value of current flowing between the source and the drain of the transistor 234 can be stable by the transistor 232 and the transistor 233.

The transistor 241 is a P-channel transistor. The high power supply voltage Vdd is input to a source of the transistor 241. A gate of the transistor 241 is connected to the gate of the transistor 221.

The transistor 242 is an N-channel transistor. A drain of the transistor 242 is connected to a drain of the transistor 241. The low power supply voltage Vss is input to a source of the transistor 242.

The transistor 243 is an N-channel transistor. A drain of the transistor 243 is connected to the gate of the transistor 217 and the drain of the transistor 217. A source of the transistor 243 is connected to a gate of the transistor 242. A gate of the transistor 243 is connected to the drain of the transistor 241.

The transistor 244 is an N-channel transistor. A drain of the transistor 244 is connected to the source of the transistor 243. The low power supply voltage Vss is input to a source of the transistor 244. A gate of the transistor 244 is connected to the gate of the transistor 227.

Note that it is not necessary to provide the transistor 242 and the transistor 243, but a value of current flowing between the source and the drain of the transistor 244 can be stable by the transistor 242 and the transistor 243.

In the current detection circuit in FIG. 4, a voltage is input from the power feeding element 211 and a voltage of the drain of the transistor 218 is output as an output signal.

Figure 5A:
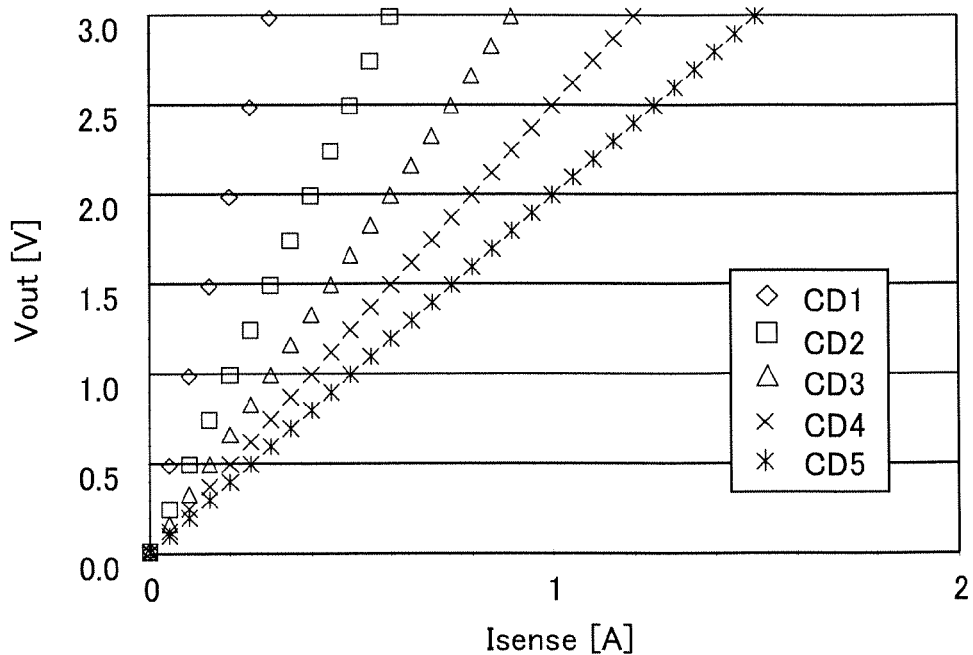
FIGS. 5A and 5B are graphs showing verification results of an operation of the current detection circuit in FIG. 4.
Figure 5B:
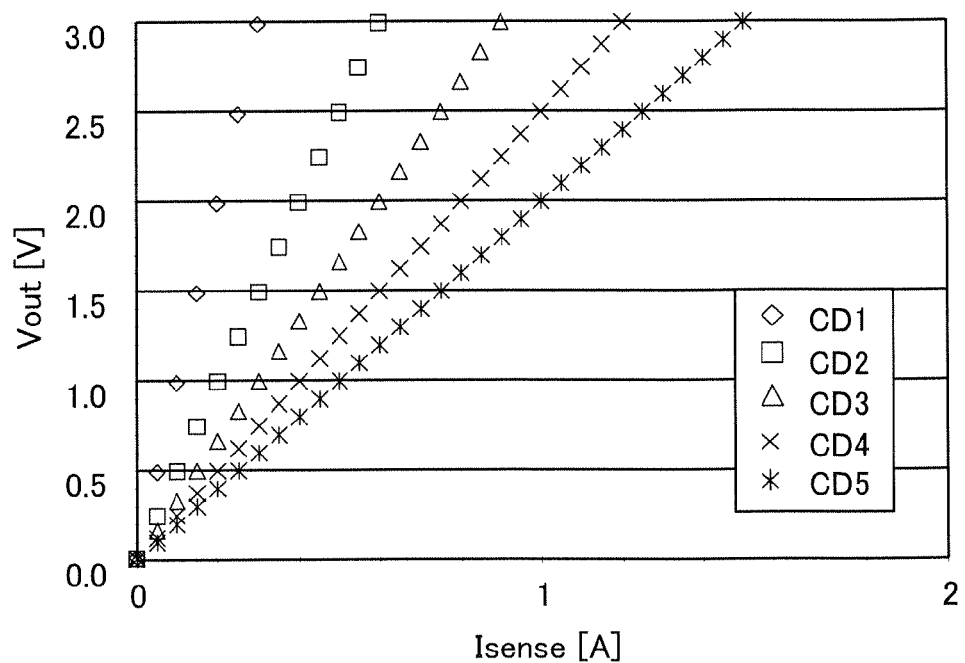

FIGS. 5A and 5B illustrate a verification result of operation of the current detection circuit in FIG. 4. FIGS. 5A and 5B are graphs showing the verification result of the operation of the current detection circuit in FIG. 4. Note that here, verification of operation is an operation of detecting a current flowing from the power feeding element 211 to the resistor 212.

Note that in the verification of the operation, each of the transistor 216, the transistor 217, the transistor 218, the transistor 221, the transistor 225, the transistor 226, the transistor 227, the transistor 228, the transistor 229, the transistor 231, the transistor 232, the transistor 233, the transistor 234, the transistor 241, the transistor 242, the transistor 243, and the transistor 244 is a top-gate transistor which includes a single crystal silicon semiconductor layer having a function as a channel formation layer.

Further, in the verification of the operation, the transistor 216, the transistor 217, the transistor 218, the transistor 221, the transistor 225, the transistor 226, the transistor 227, the transistor 228, the transistor 229, the transistor 231, the transistor 232, the transistor 233, the transistor 234, the transistor 241, the transistor 242, the transistor 243, and the transistor 244 each have a channel length of 10 μm.

Furthermore, in the verification of the operation, the transistor 216, the transistor 217, and the transistor 221 each have a channel width of 800 μm; the transistor 218 has a channel width of 1600 μm; the transistor 225, the transistor 228, the transistor 231, and the transistor 241 each have a channel width of 200 μm; and the transistor 226, the transistor 227, the transistor 229, the transistor 232, the transistor 233, the transistor 234, the transistor 242, the transistor 243, and the transistor 244 each have a channel width of 400 μm. Here, a channel width is set in the following manner: sources of the same kind of transistors are connected to each other and drains of the same kind of transistors are connected to each other so that a plurality of transistors is connected in parallel in plural stages. For example, a transistor with a channel width of 400 μm is formed in such a manner that eight transistors each having a channel width of 50 μm are connected in parallel.

In the verification of the operation, the mobility of an N-channel transistor is 402.3 cm$^2$/Vs and the mobility of a P-channel transistor is 156 cm$^2$/Vs.

In the verification of the operation, the capacitance of the capacitor 223 is 14 pF and the capacitance of the capacitor 224 is 8 pF.

In the verification of the operation, the high power supply voltage Vdd is 3 V and the low power supply voltage Vss is the same as the ground potential. A current value of a reference current source is 0.5 μA. The resistance value of the resistor 213 is 0.25Ω. The resistance values of the resistor 214 and the resistor 215 are equal to each other. Each of the resistance values of the resistor 214 and the resistor 215 is shifted in five stages: 5 kΩ (also referred to as Condition 1 or CD1), 10 kΩ (also referred to as Condition 2 or CD2), 5 kΩ (also referred to as Condition 3 or CD3), 20 kΩ (also referred to as Condition 4 or CD4), and 25 kΩ (also referred to as Condition 5 or CD5). The resistance value of the resistor 219 is 200 kΩ. At this time, a power supply voltage is 3 V.

FIG. 5A illustrates a voltage of an output signal (also referred to as the voltage Vout) of the current detection circuit with respect to a current (also referred to as a current Isense) which flows from the positive electrode of the power feeding element 211 to the second resistor terminal of the resistor 212 through the resistor 213, in the case where a voltage of 4 V is input from the power feeding element 211. As in FIG. 5A, in any of Conditions 1 to 5 in which each of the resistance values of the resistor 214 and the resistor 215 is different, the voltage of an output signal is changed in accordance with a current flowing from the power feeding element 211 through the resistor 213 and the resistor 212. Therefore, it is confirmed that the amount of current flowing from the power feeding element 211 through the resistor 213 and the resistor 212 can be detected by a value of the voltage of an output signal.

FIG. 5B illustrates a voltage of an output signal of the current detection circuit with respect to a current which flows from the positive electrode of the power feeding element 211 to the second resistor terminal of the resistor 212 through the resistor 213, in the case where a voltage of 8 V is input from the power feeding element 211. As in FIG. 5A, in any of Conditions 1 to 5 in which each of the resistance values of the resistor 214 and the resistor 215 is different, the voltage of an output signal is changed in accordance with a current flowing from the power feeding element 211. Therefore, it is confirmed that the amount of current flowing from the power feeding element 211 can be detected by a value of the voltage of an output signal even in the case where a voltage two or more times as high as the power supply voltage is input.

As described above, the current detection circuit in this embodiment detects the amount of current with the use of the voltage of an output signal in the case where a high voltage which is higher than the power supply voltage is input. In this manner, the current detection circuit in this embodiment can detect a current in a wide range.

Embodiment 5

In this embodiment, a current detection circuit which can detect a current in the case where a voltage which is lower than and equal to the ground potential is input.

Figure 6:
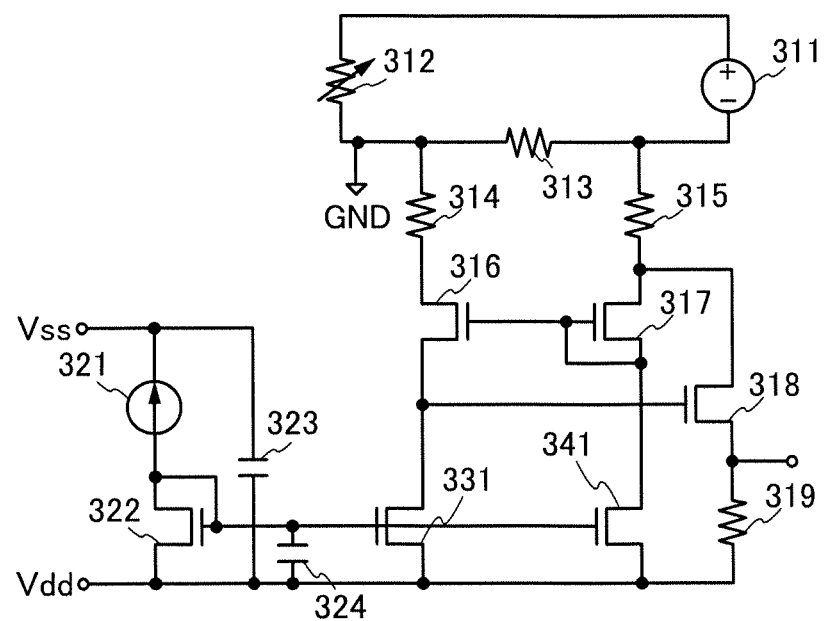
FIG. 6 illustrates an example of a current detection circuit in Embodiment 5.

First, a configuration example of the current detection circuit in this embodiment will be described with reference to FIG. 6. FIG. 6 illustrates the configuration example of the current detection circuit in this embodiment.

The current detection circuit in FIG. 6 includes a power feeding element 311, a resistor 312, a resistor 313, a resistor 314, a resistor 315, a transistor 316, a transistor 317, a transistor 318, a resistor 319, a reference current source 321, a transistor 322, a capacitor 323, a capacitor 324, a transistor 331, and a transistor 341.

The power feeding element 311 includes a positive electrode and a negative electrode. As the power feeding element 311, a photoelectric conversion element or the like can be used.

The resistor 312 is a variable resistor. A first resistor terminal of the resistor 312 is connected to a positive electrode of the power feeding element 311. The ground potential is input to a second resistor terminal of the resistor 312.

A first resistor terminal of the resistor 313 is connected to the second resistor terminal of the resistor 312. A second resistor terminal of the resistor 313 is connected to the negative electrode of the power feeding element 311.

A first resistor terminal of the resistor 314 is connected to the first resistor terminal of the resistor 313.

A first resistor terminal of the resistor 315 is connected to the second resistor terminal of the resistor 313.

The transistor 316 is an N-channel transistor. A source of the transistor 316 is connected to a second resistor terminal of the resistor 314.

The transistor 317 is an N-channel transistor. A source of the transistor 317 is connected to a second resistor terminal of the resistor 315. A drain of the transistor 317 is connected to a gate of the transistor 317 and a gate of the transistor 316.

The transistor 318 is an N-channel transistor. A source of the transistor 318 is connected to the source of the transistor 317. A gate of the transistor 318 is connected to a drain of the transistor 316. A voltage of a drain of the transistor 318 is a voltage of an output signal of the current detection circuit.

A first resistor terminal of the resistor 319 is connected to the drain of the transistor 318. The high power supply voltage Vdd is input to a second resistor terminal of the resistor 319.

The reference current source 321 includes a first current terminal and a second current terminal. The low power supply voltage Vss is input to the first current terminal of the reference current source 321. A current flows from the second current terminal of the reference current source 321 to the first current terminal of the reference current source 321.

The transistor 322 is a P-channel transistor. A drain of the transistor 322 is connected to the second current terminal of the reference current source 321. The high power supply voltage Vdd is input to a source of the transistor 322. A gate of the transistor 322 is connected to the drain of the transistor 322.

The low power supply voltage Vss is input to a first capacitor electrode of the capacitor 323. The high power supply voltage Vdd is input to a second capacitor electrode of the capacitor 323. Note that it is not necessary to provide the capacitor 323, but a value of inputted power supply voltage can be stable by the capacitor 323.

A first capacitor electrode of the capacitor 324 is connected to the gate of the transistor 322. The high power supply voltage Vdd is input to a second capacitor electrode of the capacitor 324. Note that it is not necessary to provide the capacitor 324, but a value of inputted power supply voltage can be stable by the capacitor 324.

The transistor 331 is a P-channel transistor. A drain of the transistor 331 is connected to the drain of the transistor 316. The high power supply voltage Vdd is input to a source of the transistor 331. A gate of the transistor 331 is connected to the gate of the transistor 322.

The transistor 341 is a P-channel transistor. The drain of the transistor 341 is connected to the drain of the transistor 317. The high power supply voltage Vdd is input to the source of transistor 341. A gate of the transistor 341 is connected to the gate of the transistor 322.

In the current detection circuit in FIG. 6, a voltage is input from the power feeding element 311 and a voltage of the drain of the transistor 318 is output as an output signal. Note that a circuit configuration of the current detection circuit in FIG. 6 can be simple because a value of a current generated by the current source may be lower than that in the current detection circuit in FIG. 4.

Figure 7:
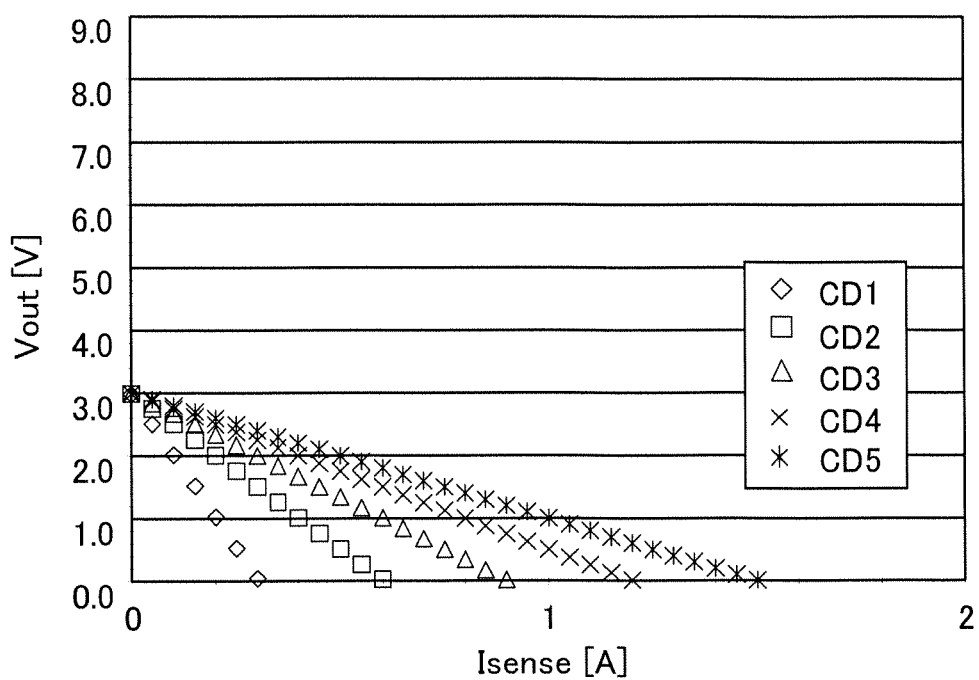
FIG. 7 is a graph showing a verification result of an operation of the current detection circuit in FIG. 6.

FIG. 7 illustrates a verification result of operation of the current detection circuit in FIG. 6. Note that here, verification of operation is an operation of detecting a current flowing from the power feeding element 311 to the resistor 312.

Note that in the verification of the operation, each of the transistor 316, the transistor 317, the transistor 318, the transistor 322, the transistor 331, and the transistor 341 is a top-gate transistor which includes a single crystal silicon semiconductor layer having a function as a channel formation layer.

Further, in the verification of the operation, the transistor 316, the transistor 317, the transistor 318, the transistor 322, the transistor 331, and the transistor 341 each have a channel length of 10 μm.

Furthermore, in the verification of the operation, the transistor 316, the transistor 317, the transistor 331, and the transistor 341 each have a channel width of 400 μm; the transistor 318 has a channel width of 800 μm; and the transistor 322 has a channel width of 1600 μm. Here, a channel width is set in the following manner: sources of the same kind of transistors are connected to each other and drains of the same kind of transistors are connected to each other so that a plurality of transistors is connected in parallel in plural stages. For example, a transistor with a channel width of 400 μm is formed in such a manner that eight transistors each having a channel width of 50 μm are connected in parallel.

In the verification of the operation, the mobility of an N-channel transistor is 402.3 $cm^2/Vs$ and the mobility of a P-channel transistor is 156 $cm^2/Vs$.

In the verification of the operation, the capacitance of the capacitor 323 is 14 pF and the capacitance of the capacitor 324 is 8 pF.

In the verification of the operation, the high power supply voltage Vdd is 3V and the low power supply voltage Vss is the same as the ground potential. A current value of a reference current source is 0.5 μA. The resistance value of the resistor 313 is 0.25Ω. The resistance values of the resistor 314 and the resistor 315 are equal to each other. Each of the resistance values of the resistor 314 and the resistor 315 is shifted in five stages (Conditions (CDs) 1 to 5): 5 kΩ (also referred to as Condition 1 or CD1), 10 kΩ (also referred to as Condition 2 or CD2), 15 kΩ (also referred to as Condition 3 or CD3), 20 kΩ (also referred to as Condition 4 or CD4), and 25 kΩ (also referred to as Condition 5 or CD5). The resistance value of the resistor 319 is 200 kΩ. At this time, a power supply voltage is 3 V.

FIG. 7 illustrates a voltage of an output signal (also referred to as the voltage Vout) of the current detection circuit with respect to a current (also referred to as a current Isense) which flows from the second resistor terminal of the resistor 312 to the negative electrode of the power feeding element 311 through the resistor 313, in the case where a voltage of 0 V is input from the power feeding element 311. As in FIG. 7, in any of Conditions 1 to 5 in which each of the resistance values of the resistor 314 and the resistor 315 is different, the voltage of an output signal is changed in accordance with a current flowing from the power feeding element 311 through the resistor 313 and the resistor 312. Therefore, it is confirmed that the amount of current flowing from the power feeding element 311 through the resistor 313 and the resistor 312 can be detected by a value of the voltage of an output signal.

As described above, the current detection circuit in this embodiment detects the amount of current with the use of the voltage of an output signal in the case where a low voltage which is lower than the reference potential is input. In this manner, the current detection circuit in this embodiment can detect a current in a wide range.

Embodiment 6

In this embodiment, an example of an electronic device including the current detection circuit in the above embodiment will be described.

The current detection circuit in the above embodiment can be provided for various electronic devices. In particular, an electronic device in which a power supply voltage greatly varies over time is preferably provided with the current detection circuit in the above embodiment.

Figure 8:
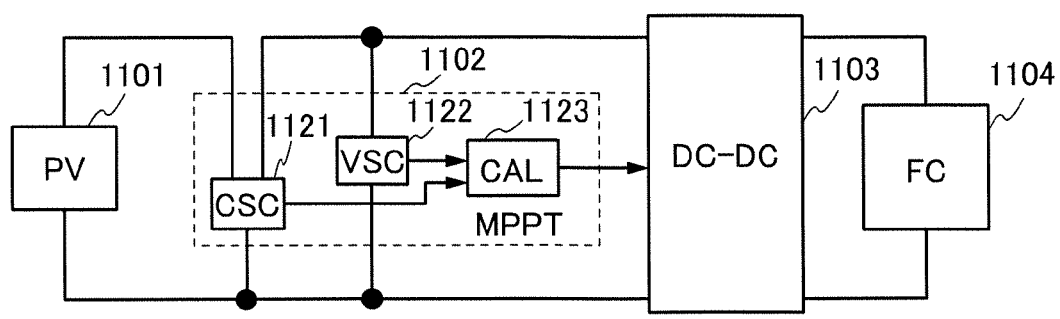
FIG. 8 is a block diagram illustrating a configuration example of an electronic device in Embodiment 6.

A configuration example of an electronic device in this embodiment will be described with reference to FIG. 8. FIG. 8 is a block diagram illustrating a configuration example of the electronic device in this embodiment.

The electronic device in FIG. 8 includes a photoelectric conversion device (also referred to as PV) 1101, a maximum power point tracker (also referred to as MPPT) 1102, a DC-DC converter circuit (also referred to as DC-DC) 1103, and a function circuit 1104.

The photoelectric conversion device 1101 has a function of supplying a current.

The maximum power point tracker 1102 includes a current detection circuit (also referred to as CSC) 1121, a voltage detection circuit (also referred to as VSC) 1122, and an arithmetic circuit (also referred to as CAL) 1123.

The current detection circuit 1121 has a function of detecting a current supplied from the photoelectric conversion device 1101 to the DC-DC converter circuit 1103 and outputting a voltage in accordance with a detection result as a signal to the arithmetic circuit 1123. As the current detection circuit 1121, the current detection circuit in the above embodiment can be used.

The voltage detection circuit 1122 has a function of detecting a voltage supplied from the photoelectric conversion device 1101 to the DC-DC converter circuit 1103 and outputting a voltage in accordance with a detection result as a signal to the arithmetic circuit 1123.

The arithmetic circuit 1123 has a function of performing an arithmetic process in accordance with signals which are input from the current detection circuit 1121 and the voltage detection circuit 1122, generating a control signal, and outputting that.

The control signal is input from the maximum power point tracker 1102 to the DC-DC converter circuit 1103. The DC-DC converter circuit 1103 has a function of generating a power supply voltage having a value in accordance with the control signal.

The power supply voltage is input from the DC-DC converter circuit 1103 to the function circuit 1104. The function circuit 1104 performs a predetermined operation when the power supply voltage is input thereto.

As illustrated in FIG. 8, an example of the electronic device in this embodiment includes a photoelectric conversion device, a current detection circuit, a maximum power point tracker, a DC-DC converter circuit, and a function circuit; detects a current which flows in accordance with a voltage supplied from an accumulating device, with the use of the current detection circuit; and controls a value of voltage generated by the DC-DC converter circuit in accordance with a detection result. With the above configuration, electric power which is supplied from the photoelectric conversion device to the DC-DC converter circuit can be controlled.

Note that the application is not limited to this, and the current detection circuit in this embodiment can be applied to various electronic devices.

This application is based on Japanese Patent Application serial no. 2010-203901 filed with Japan Patent Office on Sep. 13, 2010, the entire contents of which are hereby incorporated by reference.

What is claimed is:

1. A circuit comprising:
   a first connection terminal and a second connection terminal;
   a first resistor, a second resistor, a third resistor and a fourth resistor;
   a first transistor, a second transistor and a third transistor; and
   an output terminal, wherein one terminal of the first resistor is connected to the first connection terminal, and the other terminal of the first resistor is connected to the second connection terminal, wherein one terminal of the second resistor is connected to the one terminal of the first resistor, wherein one terminal of the third resistor is connected to the other terminal of the first resistor;

wherein a source of the first transistor is connected to the other terminal of the second resistor, wherein a source of the second transistor is connected to the other terminal of the third resistor, and a drain and a gate of the second transistor are connected to a gate of the first transistor, wherein a source of the third transistor is connected to the source of the second transistor, a gate of the third transistor is connected to a drain of the first transistor, and a drain of the third transistor is connected to the output terminal, and wherein one terminal of the fourth resistor is connected to the drain of the third transistor and the output terminal.

2. The circuit according to claim 1,
wherein the first transistor, the second transistor, and the third transistor have the same conductivity type.

3. The circuit according to claim 2,
wherein the conductivity type is an N-type conductivity.

4. The circuit according to claim 2,
wherein the conductivity type is a P-type conductivity.

5. The circuit according to claim 1,
wherein at least one of the first transistor, the second transistor, and the third transistor is a field-effect transistor.

6. A circuit comprising:
a first connection terminal and a second connection terminal;
a first resistor, a second resistor, a third resistor and a fourth resistor;
a first transistor, a second transistor and a third transistor;
a first current source and a second current source; and
an output terminal,
wherein one terminal of the first resistor is connected to the first connection terminal, and the other terminal of the first resistor is connected to the second connection terminal,
wherein one terminal of the second resistor is connected to the one terminal of the first resistor,
wherein one terminal of the third resistor is connected to the other terminal of the first resistor;
wherein a source of the first transistor is connected to the other terminal of the second resistor, and a drain of the first transistor is connected to the first current source,
wherein a source of the second transistor is connected to the other terminal of the third resistor, and a drain and a gate of the second transistor are connected to a gate of the first transistor and the second current source,
wherein a source of the third transistor is connected to the source of the second transistor, a gate of the third transistor is connected to the drain of the first transistor, and a drain of the third transistor is connected to the output terminal, and
wherein one terminal of the fourth resistor is connected to the drain of the third transistor and the output terminal.

7. The circuit according to claim 6,
wherein the first transistor the second transistor, and the third transistor have the same conductivity type.

8. The circuit according to claim 7,
wherein the conductivity type is an N-type conductivity type.

9. The circuit according to claim 7,
wherein the conductivity type is a P-type conductivity type.

10. The circuit according to claim 6,
wherein at least one of the first transistor, the second transistor, and the third transistor is a field-effect transistor.

11. The circuit according to claim 6,
wherein the first current source further comprising a current mirror circuit and a third current source, and
wherein the current mirror circuit and the third current source are configured to be applied a potential difference between a high supply voltage and a low supply voltage.

12. The circuit according to claim 11,
wherein the other terminal of the fourth resistor is connected to the low supply voltage.

13. The circuit according to claim 11,
wherein the second current source is connected to the low supply voltage.

14. A circuit comprising:
a first connection terminal and a second connection terminal;
a first resistor, a second resistor, a third resistor and a fourth resistor;
a first transistor, a second transistor and a third transistor;
a first current source and a second current source; and
an output terminal,
wherein one terminal of the first resistor is connected to the first connection terminal, and the other terminal of the first resistor is connected to the second connection terminal,
wherein one terminal of the second resistor is connected to the one terminal of the first resistor,
wherein one terminal of the third resistor is connected to the other terminal of the first resistor;
wherein a source of the first transistor is connected to the other terminal of the second resistor, and a drain of the first transistor is connected to the first current source,
wherein a source of the second transistor is connected to the other terminal of the third resistor, and a drain and a gate of the second transistor are connected to a gate of the first transistor and the second current source,
wherein a source of the third transistor is connected to the source of the second transistor, a gate of the third transistor is connected to the drain of the first transistor, and a drain of the third transistor is connected to the output terminal,
wherein one terminal of the fourth resistor is connected to the drain of the third transistor and the output terminal, and
wherein the first current source comprises current mirror circuit.

15. The circuit according to claim 14,
wherein the first transistor, the second transistor, and the third transistor have the same conductivity type.

16. The circuit according to claim 15,
wherein the conductivity type is an N-type conductivity.

17. The circuit according to claim 15,
wherein the conductivity type is a P-type conductivity type.

18. The circuit according to claim 14,
wherein at least one of the first transistor, the second transistor, and the third transistor is a field-effect transistor.

* * * * *